United States Patent
Takeuchi

[11] Patent Number: 5,936,277
[45] Date of Patent: *Aug. 10, 1999

[54] MOS TRANSISTOR WITH IMPURITY-IMPLANTED REGION

[75] Inventor: Nobuyoshi Takeuchi, Tokyo, Japan

[73] Assignee: NKK Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/735,428

[22] Filed: Oct. 22, 1996

[30] Foreign Application Priority Data

Oct. 31, 1995 [JP] Japan ................................... 7-283175

[51] Int. Cl.$^6$ .............................................. H01L 27/088
[52] U.S. Cl. ......................... 257/336; 257/344; 257/345; 257/408; 438/163; 438/179; 438/286; 438/305; 438/306; 438/307
[58] Field of Search .................................. 257/408, 336, 257/344, 345

[56] References Cited

U.S. PATENT DOCUMENTS

| | | | |
|---|---|---|---|
| 5,359,221 | 10/1994 | Miyamoto et al. | 257/408 |
| 5,448,101 | 9/1995 | Ono et al. | 257/345 |
| 5,512,770 | 4/1996 | Hong | 257/345 |
| 5,536,959 | 7/1996 | Kellam | 257/336 X |
| 5,545,572 | 8/1996 | Lee et al. | 437/26 |
| 5,552,623 | 9/1996 | Nishizawa et al. | 257/345 |

FOREIGN PATENT DOCUMENTS 5551363  11/1980  Japan ..................................... 257/345

OTHER PUBLICATIONS

A. Hiroki et al; "A High Performance 0.1 μm MOSFET with Asymmetric Channel Profile"; 1995, pp. 17.7.1–17.7.4; IEDM 95–439.

H. Hwang et al; "Performance and Reliability Optimization of Ultra Short Channel CMOS Device for Giga–bit DRAM Applications"; 1995; pp. 17.6.1–17.6.4, IEDM 95–435.

T. Hori; "A 0.1 μm CMOS Technology with Tilt–Implanted Punchthrough Stopper (TIPS)";1994; pp. 4.3.1–4.3.4, IEDM 94–75.

S. Shimizu et al; "0.1μm CMOS Process for High Performance and High Reliability" 1994; pp. 4.1.1–4.1.4; IEDM 94–67.

A. Hori et al; 0.05μm–CMOS with Ultra Shallow Source/Drain Junctions Fabricated by 5KE V Ion Implantation and Rapid Thermal Annealing; 1994; pp. 19.1.1–19.1.4; IEDM 94–485.

*Primary Examiner*—William Mintel
*Attorney, Agent, or Firm*—Frishauf, Holtz, Goodman, Langer & Chick

[57] ABSTRACT

A MOS transistor includes a semiconductor substrate of a first conductivity type having a major surface, a source and drain of a second conductivity type formed on the major surface to define a channel region therebetween, and a gate arranged in the channel region via an insulating film. The MOS transistor includes an impurity-implanted region of the first conductivity type located at a substrate portion which is deeper than the channel region and is shifted to a source side from a region corresponding to the channel region.

17 Claims, 4 Drawing Sheets

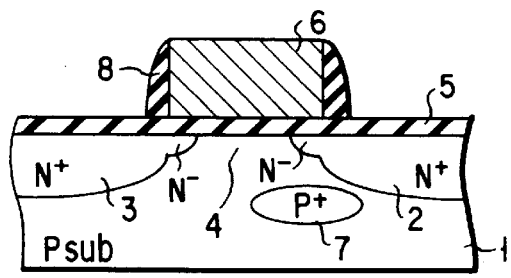
F I G. 1
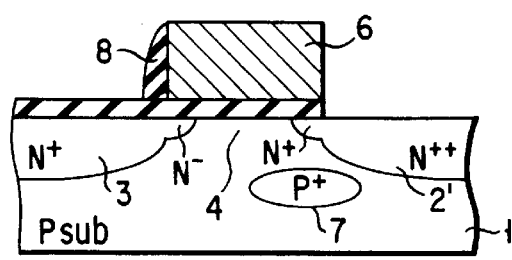
F I G. 2
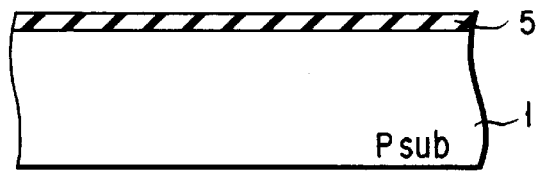
F I G. 3A
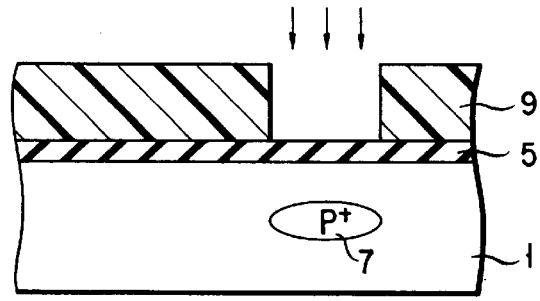
F I G. 3B
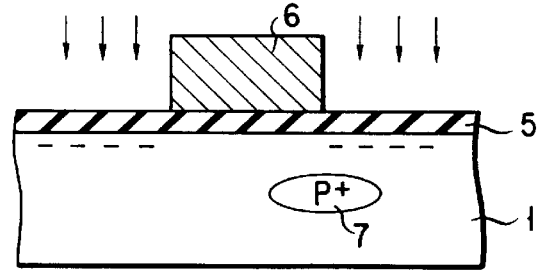
F I G. 3C
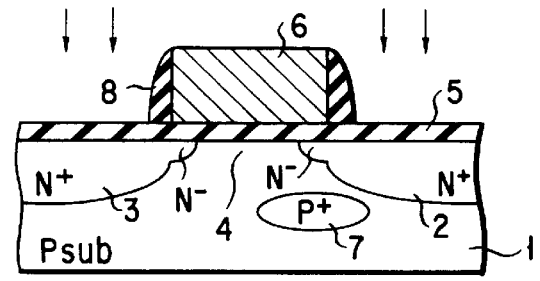
F I G. 3D

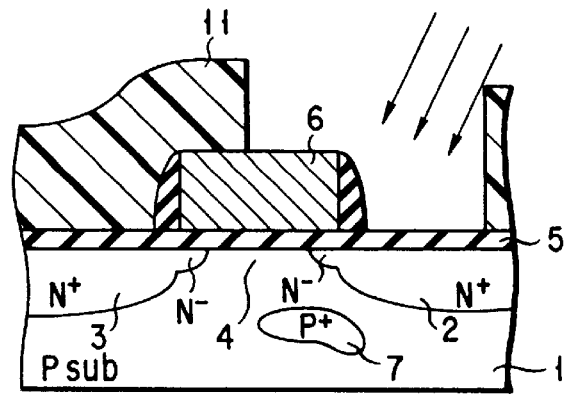
F I G. 5
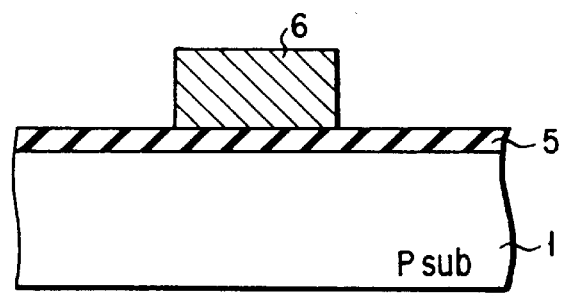
F I G. 6A
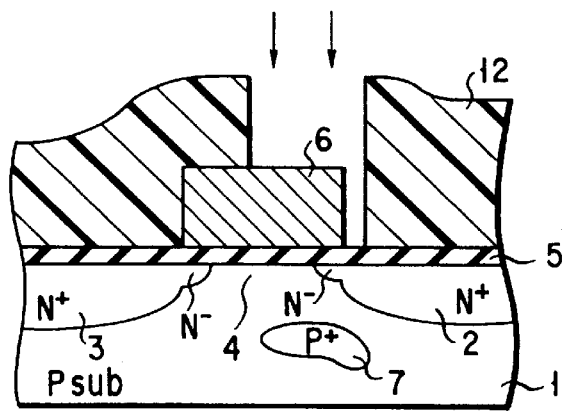
F I G. 6B
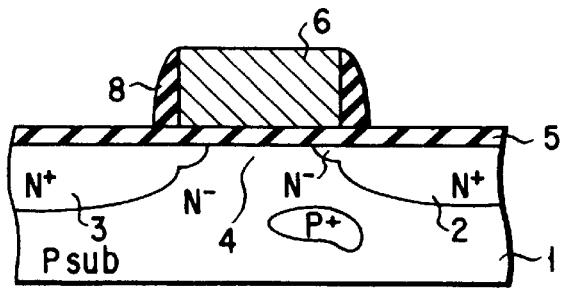
F I G. 6C

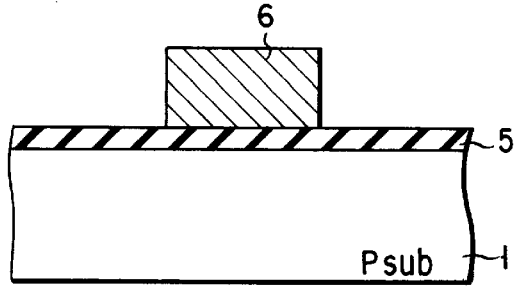
F I G. 7A
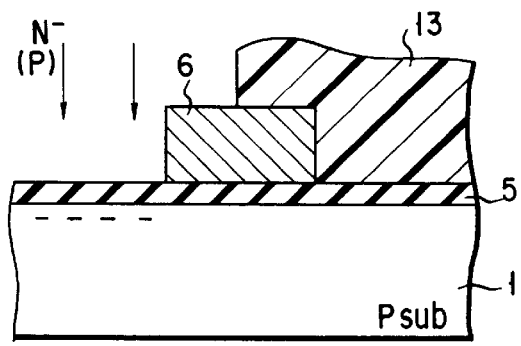
F I G. 7B
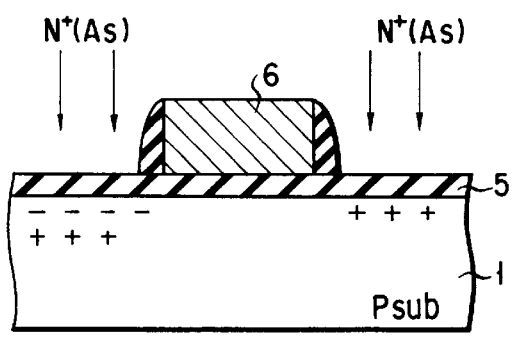
F I G. 7C
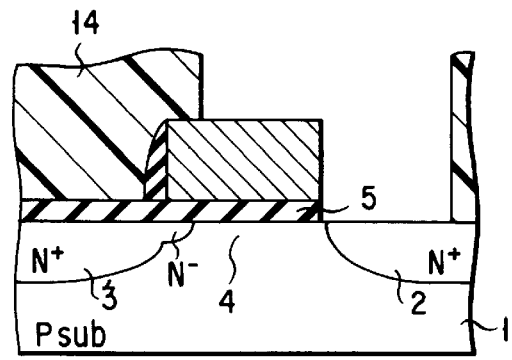
F I G. 7D
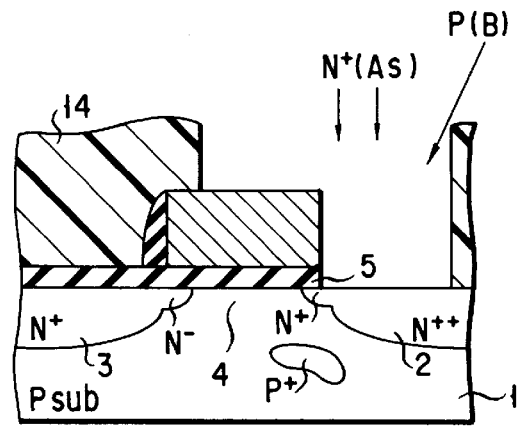
F I G. 7E
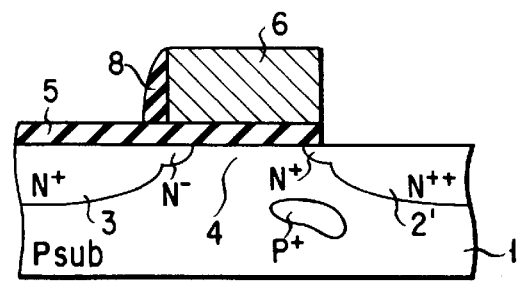
F I G. 7F

MOS TRANSISTOR WITH IMPURITY-IMPLANTED REGION

BACKGROUND OF THE INVENTION

1. Field of the Invention

The present invention relates to a MOS transistor and a method of manufacturing the same.

2. Description of the Related Art

Conventionally, to prevent punch-through in a MOS transistor, an impurity of the same conductivity type as that of a substrate is implanted in a region deeper than a channel formation position. The ions are implanted in the whole active region before a gate electrode is formed. Therefore, the ion-implanted region is symmetrical about the source and drain, and relatively heavily doped impurity regions of the same conductivity type as that of the substrate are also formed in the source and drain formation regions.

One of the factors that determine the speed of the MOS transistor is the junction capacitance of each diffusion layer. As described above, in the MOS transistor, the relatively heavily doped impurity region is also formed on the drain side to which a voltage is generally applied. For this reason, it requires a long time to charge/discharge the capacitance of the drain side in an operation, and an increase in speed of the transistor operation is obstructed.

SUMMARY OF THE INVENTION

It is an object of the present invention to provide a MOS transistor capable of a high-speed operation, and a method of manufacturing the same.

According to one aspect of the present invention, there is provided a MOS transistor comprising:

a semiconductor substrate of a first conductivity type having a major surface;

a source and drain of a second conductivity type formed on the major surface to dispose a channel region therebetween;

a gate arranged over the channel region, an insulating film being disposed between the gate and the channel region; and an impurity-implanted region of the first conductivity type located at a substrate portion which is deeper than the channel region and is shifted to a source side from a region corresponding to the channel region.

According to another aspect of the present invention, there is provided a MOS transistor comprising:

a semiconductor substrate of a first conductivity type having a major surface;

a source and drain of a second conductivity type formed on the major surface to dispose a channel region therebetween;

a gate arranged over the channel region, an insulating film being disposed between the gate and the channel region; and an impurity-implanted region of the first conductivity type located at a substrate position which is deeper than the channel region and is shifted to a source side from a region corresponding to the channel region, wherein both the source and the drain have LDD structures, and the source has a concentration higher than that of the drain.

According to still another aspect of the present invention, there is provided a method of manufacturing a MOS transistor, comprising the steps of:

forming an insulating film on a semiconductor substrate of a first conductivity type having a major surface;

implanting impurity ions of the first conductivity type at a position deeper than the major surface of the substrate to form an impurity-implanted region;

forming a gate over the major surface of the substrate via the insulating film; and forming a source and drain of a second conductivity type on the major surface of the substrate to dispose a channel region, wherein the impurity-implanted region is located at a substrate portion which is deeper than the channel region and is shifted to a source side from a region corresponding to the channel region.

According to still another aspect of the present invention, there is provided a method of manufacturing a MOS transistor, comprising the steps of:

forming an insulating film on a semiconductor substrate of a first conductivity type having a major surface;

implanting impurity ions of the first conductivity type at a position deeper than the major surface of the substrate to form an impurity-implanted region;

forming a gate over the major surface of the substrate via the insulating film; and forming a source and drain of a second conductivity type on the major surface of the substrate to dispose a channel region, wherein the impurity-implanted region is located at a substrate portion which is deeper than the channel region and is shifted to a source side from a region corresponding to the channel region, both the source and the drain have LDD structures, and the source has a concentration higher than that of the drain.

According to the present invention, there are provided a MOS transistor capable of a high-speed operation while suppressing punch-through, and a method of manufacturing the same are provided. Further, there are provided a MOS transistor which can cope with a higher-speed operation and a short channel effect, and a method of manufacturing the same.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a sectional view showing a MOS transistor according to one embodiment of the present invention;

FIG. 2 is a sectional view showing a MOS transistor according to another embodiment of the present invention;

FIGS. 3A to 3D are views showing the steps of an example of a method of manufacturing the MOS transistor shown in FIG. 1;

FIG. 5 is a sectional view for explaining another method of partial gate implantation;

FIGS. 6A to 6C are views showing the steps of still another example of the method of manufacturing the MOS transistor shown in FIG. 1; and FIGS. 7A to 7F are views showing an example of a method of manufacturing the MOS transistor shown in FIG. 2.

DETAILED DESCRIPTION OF THE PREFERRED EMBODIMENTS

Figure 4A:
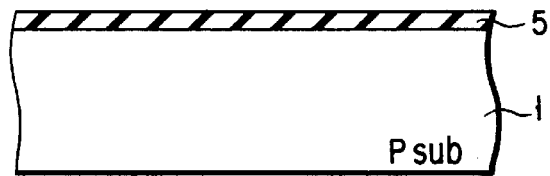
FIGS. 4A to 4D are views showing the steps of another example of the method of manufacturing the MOS transistor shown in FIG. 1.

The present invention will be described in detail below.

As described above, to prevent punch-through in a MOS transistor, an impurity of the same conductivity type as that of a substrate is conventionally implanted in a region deeper than a channel formation position. The ions are normally implanted in the whole active region before a gate electrode is formed. Therefore, relatively heavily doped impurity regions of the same conductivity type as that of the substrate are also formed in the source and drain formation regions.

The junction capacitance of each diffusion layer is one of the factors that determine the speed of operation of the MOS transistor. As the junction capacitance is decreased, electrical charges to charge/discharge the capacitance are decreased to shorten the charge/discharge time, i.e., increase the speed.

Assuming that the concentration of the diffusion layer such as the source or drain is represented by $N_D$, and the impurity concentration on the substrate side is represented by $N_S$, a junction capacitance C of the diffusion layer is proportional to $\{(N_D \cdot N_S)/(N_D+N_S)\}^{1/2}$. Since $N_D > N_S$ in general, C is smaller as $N_S$ is lower. Therefore, the concentration of the substrate is preferably low.

On the other hand, since a voltage is generally applied to the drain side in the MOS transistor, the substrate concentration around the drain is desirably low. However, to prevent punch-through, a portion having a high substrate concentration must be formed to suppress the extension of a depletion layer from the drain.

From these points, it is found that a more heavily doped region is preferably formed on the source side in a region between the source and drain where the depletion layer extends from the drain, and a lightly doped portion is formed on the drain side.

In the present invention, therefore, an impurity-implanted region (to be referred to as a partial gate implanted region hereinafter) of the same conductivity type as that of the substrate is formed at a portion which is deeper than a channel region and is shifted to the source side from a region corresponding to the channel region. According to the present invention, the demand for a higher-speed operation is satisfied while suppressing punch-through.

FIG. 1 is a sectional view showing a MOS transistor according to one embodiment of the present invention. This MOS transistor has a source 2 and a drain 3 which have LDD structures on the major surface of a semiconductor substrate 1 of the first conductivity type (p type in FIG. 1), and has a gate 6 on a channel region 4 disposed therebetween. An insulating film 5 is disposed between the channel region 4 and the gate 6. The MOS transistor has a partial gate implanted region 7 of the same conductivity type as that of the substrate at a portion which is deeper than the channel region 4 and is shifted to the source side from a region corresponding to the channel region 4. The partial gate implanted region 7 is spaced from and overlaps the source 2 in a thickness direction of the semiconductor substrate 1. In addition, the impurity-implanted region is separated from the drain and extends from a location corresponding to and spaced from the source to a position corresponding to the center of the channel region. Spacers 8 are formed on the two sides of the gate 6.

FIG. 2 is a sectional view showing a MOS transistor according to another embodiment of the present invention. This MOS transistor has the same basic structure as the structure in FIG. 1 except that a source 2' having a heavily doped LDD structure of $N^{++}-N^+$ is formed in place of the source 2 having the LDD structure of $N^+-N^-$ in FIG. 1. If the source is heavily doped in this manner, the resistance of this portion can be decreased to further increase the speed. In forming this structure, an LDD structure of As and As is formed for the source 2, whereas an LDD structure of P and As is formed for a drain 3. Since As having a low diffusion rate is doped in the source side in this structure, a MOS transistor in which the gate length can be further decreased and which is suitable for a short channel effect is realized.

Next, a method of manufacturing the MOS transistor according to the present invention will be described.

In the first method, a portion having a high impurity concentration is formed on the source side by using the alignment technique of photolithography. This method will be explained with reference to FIGS. 3A to 3D.

First, as shown in FIG. 3A, a gate insulating film 5 is formed on an Si substrate 1 of, e.g., the p type. As shown in FIG. 3B, a mask pattern 9 is formed, and impurity ions of the same conductivity type as that of the substrate, e.g., B ions are implanted to form a partial gate implanted region 7. In a recent LSI, the acceleration voltage of ion implantation and the dose are generally 80 to 150 keV and the order of $10^{13}/cm^2$, but are not limited to them.

Next, as shown in FIG. 3C, a poly-Si layer is formed as a gate electrode, and a resist pattern is formed by photolithography. Thereafter, etching is performed to form a gate 6. Light doping is performed using the gate 6 as a mask to form a source and drain having LDD structures. In forming the gate 6, an offset value is set in an alignment device such that the partial gate implanted region 7 formed in advance by ion implantation is located at a position shifted to the source side immediately below the gate 6 and a resist pattern is formed according to the offset value.

A recent i-line stepper can perform alignment with respect to an alignment position X as a target with a precision of $|X|+3\sigma_{n-1} \leq 60$ nm, which is sufficient for not only currently popular 0.5-µm rule design devices but also 0.35-µm rule design devices in the next generation.

Thereafter, as shown in FIG. 3D, a spacer 8 consisting of an insulating film is formed on each side of the gate 6. Doping is performed at a dose higher than that of the previous doping to form the source 2 and the drain 3 having the LDD structures. If the source 2 and the drain 3 are of the n type, e.g., P is lightly doped, and then As is heavily doped to form the LDD structures.

Although partial gate implantation is performed after the gate oxide film is formed in this embodiment described above, it may be performed before the gate oxide film is formed.

In the second method, a partial gate implanted pattern is adjusted to be aligned. This method will be explained with reference to FIGS. 4A to 4D.

Figure 4B:
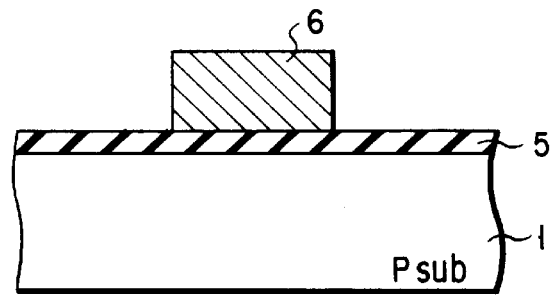

First, as shown in FIG. 4A, a gate insulating film 5 is formed on an Si substrate 1 of, e.g., the p type. A poly-Si layer is formed on the gate insulating film 5. This layer is etched into a gate 6 by a photolithography technique, as shown in FIG. 4B.

Figure 4C:
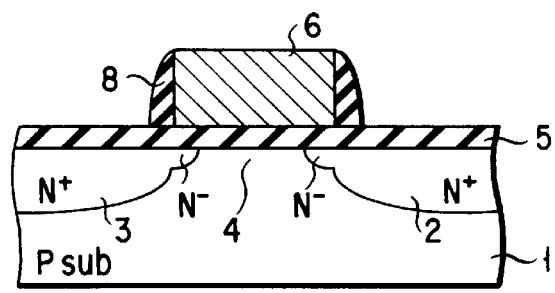
Figure 4D:
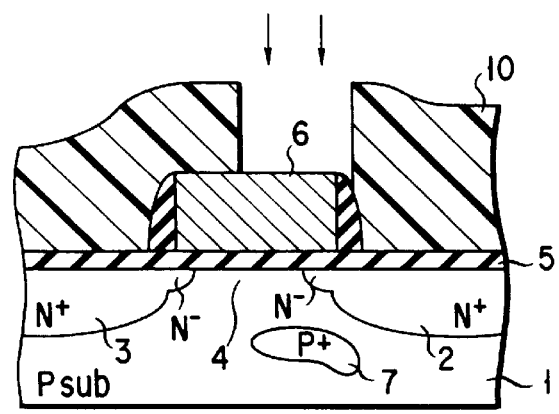

As shown in FIG. 4C, diffusion layers are formed as a source 2 and a drain 3 having LDD structures by the same procedure as described above. Then, a partial gate implanted pattern is aligned. That is, as shown in FIG. 4D, an offset value is set such that a resist 10 remains on part on the drain side of the gate 6 and a pattern is formed according to the offset value. Ions are so implanted as to move through the gate 6 by using vertical implantation or oblique implantation with on angle of 7°. In this case, ions must have a high enough energy to move through the gate 6. In this case, the impurity is preferably B.

In this partial gate implantation, oblique ion implantation shown in FIG. 5 can be used. In FIG. 5, a resist pattern is formed such that a resist 11 covers part on the drain 3 side of the gate 6, and no resist covers the source 2 side. An impurity is implanted by using oblique ion implantation with an angle of more than 7°. At this time, a higher acceleration voltage is preferably used as far as the impurity does not move through the gate 6. This is because ions are obliquely implanted to increase the required range. If the acceleration voltage is insufficient, the impurity may enter a portion immediately below the channel to vary the threshold value. To the contrary, if the acceleration voltage is too high, the impurity reaches the drain. The acceleration voltage at this time is desirably 150 keV or less.

When such oblique ion implantation is used, the source side is set open. For this reason, a higher precision is not required for the alignment of the partial gate pattern. In this case, either B or P can be used as an impurity.

The second method exemplifies the case wherein partial gate implantation is performed after the source and drain are formed. The partial gate implantation can be performed before the source and drain are formed. FIGS. 6A to 6C show this case. First, a gate insulating film 5 is formed. Then, as shown in FIG. 6A, a poly-Si layer is formed as a gate electrode on the insulating film 5. A resist pattern is formed by photolithography, and etching is performed to form a gate 6. As shown in FIG. 6B, an offset value is set and a pattern is formed such that a resist 12 remains on part on a drain 3 side of the gate 6. Ions are so implanted as to move through the gate 6 by using vertical implantation or oblique implantation with an angle of 7° to form a partial gate implanted region 7. Thereafter, as shown in FIG. 6C, a source 2 and the drain 3 are formed as diffusion layers having LDD structures.

Next, a method of manufacturing the higher-speed MOS transistor shown in FIG. 2 will be described with reference to FIGS. 7A to 7F.

First, a gate insulating film 5 is formed on a p-type Si substrate. As shown in FIG. 7A, a poly-Si layer is formed as a gate electrode on the insulating film 5. A resist pattern is formed by photolithography, and etching is performed to form a gate 6. Then, as shown in FIG. 7B, a resist mask 13 is formed on the source side, and P ions are implanted in the drain side. At this time, the ions are generally implanted at a relatively low concentration using an acceleration voltage of 30 to 80 keV and a dose of $1 \times 10^{13}$ to $10^{14}/cm^2$. As shown in FIG. 7C, spacers 8 are formed on the two sides of the gate 6, and As ions are implanted in source and drain formation regions. At this time, the acceleration voltage and the dose are generally 30 to 80 keV and $1 \times 10^{15}$ to $5 \times 10^{15}/cm^2$.

Thereafter, as shown in FIG. 7D, a partial gate pattern open on the source side is formed with a resist 14. The spacer on the source side and the gate oxide film on the source side are etched and removed by using BHF or diluted HF. Subsequently, as shown in FIG. 7E, As ions are implanted in the source-side diffusion layer. At this time, the acceleration voltage and the dose are properly 30 to 60 keV and $1 \times 10^{14}$ to $1 \times 10^{15}/cm^2$. Further, B ions are implanted as a p-type impurity for partial gate implantation. At this time, the acceleration voltage and the dose are generally 50 to 150 keV and the order of $10^{13}/cm^2$ respectively. In this case, if As ions are vertically implanted, and B ions are obliquely implanted, these ions can be implanted with one pattern without increasing the number of masks.

In this manner, a MOS transistor having a partial gate implanted region 7 and a heavily doped source 2' can be manufactured as shown in FIG. 7F.

In this MOS transistor, since As is heavily doped in the source 2', the resistance of the source-side diffusion layer is low. In addition, since As having a low diffusion rate is doped in the source side, the MOS transistor is resistant to a short channel effect. Therefore, the MOS transistor can cope with a higher-speed operation and a short channel effect.

Note that the above description has exemplified the NMOS transistor. However, the present invention can be applied to a PMOS transistor, as a matter of course. The source and drain need not have the LDD structures.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A MOS transistor comprising:

a semiconductor substrate of a first conductivity type having a major surface;

a source and a drain of a second conductivity type formed on said major surface such that a channel region is formed between the source and the drain;

a gate arranged over the channel region;

an insulating film disposed between the gate and the channel region; and an impurity-implanted region of the first conductivity type located at a substrate position which is deeper than the channel region and is shifted toward a source side from a region corresponding to the channel region, the impurity-implanted region overlapping the source in a thickness direction of the semiconductor substrate, the impurity-implanted region extending from a location corresponding to and spaced from the source to a center portion of the channel region or to a neighborhood of the center portion of the channel region;

wherein both the source and the drain have LDD structures, and the source has a concentration higher than that of the drain.

2. A transistor according to claim 1, wherein the impurity-implanted region has an impurity concentration higher than that of another substrate portion.

3. A method of manufacturing the MOS transistor of claim 1, comprising the steps of:

forming an insulating film on a semiconductor substrate of a first conductivity type having a major surface;

implanting impurity ions of the first conductivity type at a position deeper than said major surface of said semiconductor substrate to form an impurity-implanted region;

forming a gate over said major surface of said semiconductor substrate via said insulating film; and forming a source and a drain of a second conductivity type on said major surface of said semiconductor substrate such that a channel region is formed between the source and the drain;

wherein the impurity-implanted region is located at a substrate portion which is deeper than the channel region and is shifted toward a source side from a region corresponding to the channel region, wherein the impurity-implanted region overlaps the source in a thickness direction of said semiconductor substrate, and wherein the impurity-implanted region extends from a location corresponding to and spaced from the source to a center portion of the channel region or to a neighborhood of the center portion of the channel region.

4. A method according to claim 3, wherein the step of implanting said impurity ions is performed before the step of forming said gate.

5. The MOS transistor according to claim 1, wherein said impurity-implanted region is disposed proximate to the source.

6. The MOS transistor according to claim 1, wherein an end portion of said impurity-implanted region, which is on a side of the source, is positioned below the source and separated from the source by a distance.

7. A MOS transistor comprising:

a semiconductor substrate of a first conductivity type having a major surface;

a source and a drain of a second conductivity type formed on said major surface such that a channel region is formed between said source and drain;

a gate arranged over the channel region;

an insulating film disposed between the gate and the channel region;

an impurity-implanted region of the first conductivity type located at a substrate portion which is deeper than the channel region and which is shifted toward a source side from a region corresponding to the channel region, an end portion of the impurity-implanted region which faces the drain, being separated from the drain so as to avoid increasing a junction capacitance between the drain and the impurity-implanted region, and each of said source and said drain having a LDD structure, and said source having an impurity concentration higher than that of said drain.

8. The MOS transistor according to claim 7, wherein the impurity-implanted region has an impurity concentration higher than that of another substrate portion.

9. The MOS transistor according to claim 7, wherein said impurity-implanted region is disposed proximate to the source.

10. The MOS transistor according to claim 7, wherein an end portion of said impurity-implanted region, which is on a side of the source, is located below the source so as to be separated from the source by a distance.

11. The MOS transistor according to claim 7, wherein a portion of said impurity-implanted region, which is nearest the drain, is located at a level of the MOS transistor that is at least equal to that of a bottom of the source.

12. The method of manufacture according to claim 3, wherein said impurity-implanted region is proximate the source.

13. The method of manufacture according to claim 3, wherein an end portion of said impurity-implanted region, which is on a side of the source, is located below the source and separated from the source by a distance.

14. A method of manufacturing the MOS transistor of claim 7, comprising the steps of:

forming an insulating film on a semiconductor substrate of a first conductivity type having a major surface;

implanting impurity ions of the first conductivity type at a position deeper than said major surface of said substrate to form an impurity-implanted region;

forming a gate over said major surface of said substrate via said insulating film; and forming a source and drain of a second conductivity type on said major surface of said substrate such that a channel region is formed between said source and drain, wherein the impurity-implanted region of the first conductivity type is located at a substrate portion which is deeper than the channel region and which is shifted toward a source side from a region corresponding to the channel region, and wherein an end portion of the impurity-implanted region which is faces the drain, is separated from the drain so as to avoid increasing a junction capacitance between the drain and the impurity-implanted region, and each of said source and said drain having a LDD structure, and said source having an impurity concentration higher than that of said drain.

15. The method of manufacture according to claim 14, wherein the step of implanting said impurity ions occurs prior to the step of forming said gate.

16. The method of manufacture according to claim 14, wherein said impurity-implanted region is disposed proximate to the source.

17. The method of manufacture according to claim 14, wherein an end portion of said impurity-implanted region, which is on a side of the source, is located below the source and separated from the source by a distance.

* * * * *